(12) United States Patent
Utsumi

(10) Patent No.: US 8,438,725 B2
(45) Date of Patent: May 14, 2013

(54) METHOD OF MOVING A BOARD IMAGING DEVICE AND A MOUNTING APPARATUS

(75) Inventor: Tomoyoshi Utsumi, Shizuoka (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 640 days.

(21) Appl. No.: 12/532,380

(22) PCT Filed: Mar. 26, 2008

(86) PCT No.: PCT/JP2008/055698
§ 371 (c)(1),
(2), (4) Date: Sep. 21, 2009

(87) PCT Pub. No.: WO2008/120631
PCT Pub. Date: Oct. 9, 2008

(65) Prior Publication Data
US 2010/0101082 A1    Apr. 29, 2010

(30) Foreign Application Priority Data
Mar. 30, 2007   (JP) ................ P2007-092297

(51) Int. Cl.
*H05K 3/30* (2006.01)
*B23P 19/00* (2006.01)

(52) U.S. Cl.
USPC .............. 29/833; 29/739; 29/740; 414/737

(58) Field of Classification Search .......... 29/832, 29/833, 739, 740, 741, 743, 564.1; 348/143, 348/98; 414/737
See application file for complete search history.

(56) References Cited

U.S. PATENT DOCUMENTS

| 5,839,186 | A | 11/1998 | Onodera | |
|---|---|---|---|---|
| 5,911,456 | A * | 6/1999 | Tsubouchi et al. | 29/833 |
| 6,154,957 | A * | 12/2000 | Tsubouchi et al. | 29/836 |
| 6,571,462 | B1 * | 6/2003 | Mimura et al. | 29/743 |
| 6,606,790 | B2 * | 8/2003 | Hidese | 29/832 |
| 6,918,176 | B2 * | 7/2005 | Nagao et al. | 29/832 |
| 2002/0173876 | A1 | 11/2002 | Fisher et al. | |

FOREIGN PATENT DOCUMENTS

| DE | 10 2004 036 990 A1 | 3/2006 |
|---|---|---|
| JP | 9-246789 A | 9/1997 |
| JP | 9-307297 A | 11/1997 |
| JP | 10-209688 A | 8/1998 |
| JP | 2000-114787 A | 4/2000 |
| JP | 2001-135989 A | 5/2001 |
| JP | 3746127 B2 | 12/2005 |

OTHER PUBLICATIONS

International Search Report; PCT/JP2008/055698; Apr. 22, 2008.
The Extended European Search Report dated Jan. 13, 2012; Application No./Patent No. 08722863.1-2214/2134149PCT/JP2008055698.

* cited by examiner

*Primary Examiner* — Carl Arbes
(74) *Attorney, Agent, or Firm* — Studebaker & Brackett PC; Donald R. Studebaker

(57) ABSTRACT

A mounting apparatus mounts a component (A) on a board (W). The mounting apparatus is provided with a head unit (40) wherein a plurality of heads (41) for picking up components (A) are arranged in a prescribed direction, a head unit transfer device (4) for moving the head unit (40), a board imaging camera (21) (board imaging device) disposed on the head unit (40) for capturing an image of the board (W), and a camera moving device (25) (imaging device moving device) which moves the board imaging camera (21) relative to the head unit (40) in the arrangement direction of the heads (41).

4 Claims, 10 Drawing Sheets

METHOD OF MOVING A BOARD IMAGING DEVICE AND A MOUNTING APPARATUS

TECHNICAL FIELD

The present invention relates to a mounting apparatus and a mounting method for mounting electronic components on a board as well as to a method of transferring a board imaging device of the mounting apparatus.

BACKGROUND ART

A conventionally known mounting apparatus for mounting electronic components on a board is provided with a head unit having a plurality of heads capable of picking up the components by suction that are arranged along a specific direction (X-axis direction), in which each head of the head unit is configured to pick up a component supplied from a component feeder by suction, transport the component to a point above the board and mount the component in position.

In this kind of mounting apparatus, the head unit is provided with a board imaging camera for recognizing reference marks or the like on the board. While one such board imaging camera is normally provided, there exist some mounting apparatuses whose head unit is provided with a plurality of board imaging cameras.

In a mounting apparatus shown in Patent Document 1, for example, a head unit is provided with a pair of board imaging cameras at both ends thereof along the X-axis direction. Unlike the mounting apparatus provided with one board imaging camera only, this mounting apparatus is configured such that a total movable range of the individual board imaging cameras obtained as the sum of movable ranges thereof is larger than a movable range of the head unit. This means that the structure of Patent Document 1 makes it possible to provide a specified imaging range and carry out imaging operation with high efficiency while reducing the amount of movement of the head unit.

As the conventional mounting apparatus shown in Patent Document 1 cited above is provided with the two board imaging cameras, however, it is necessary that the mounting apparatus have, in addition to the cameras, two sets of elements for carrying out the imaging operation, such as wirings for the cameras and signal processing circuits. Accordingly, the conventional mounting apparatus of Patent Document 1 has had a problem it requires an increased number of components, resulting in a higher degree of structural complexity and a cost increase. Patent Document 1: Japanese Patent No. 3746127 (Claim and FIG. 2)

DISCLOSURE OF THE INVENTION

The present invention has been made in light of the aforementioned problem. Accordingly, it is an object of the invention to provide a mounting apparatus, a mounting method and a method of transferring a board imaging device of the mounting apparatus which make it possible to simplify the structure and reduce cost while improving the efficiency of imaging operation.

To achieve this object, a mounting apparatus according to the present invention is a mounting apparatus for mounting components on a board comprising a head unit in which a plurality of heads for picking up the components are arranged side by side along a specific direction, a head unit transfer device for moving the head unit, a board imaging device provided on the head unit for capturing an image of the board, and an imaging device moving device for moving the board imaging device along the head arrangement direction relative to the head unit.

According to this mounting apparatus, the amount of movement of the head unit by the head unit transfer device can be reduced, so that it is possible to perform imaging operation with high efficiency. Moreover, as the number of board imaging devices to be provided can be reduced in this mounting apparatus, it is possible to achieve simplification of the apparatus structure and a cost reduction.

Also, a method for moving a board imaging device of a mounting apparatus according to the present invention is a method for moving the board imaging device of the mounting apparatus for mounting components on a board, the mounting apparatus comprising a head unit in which a plurality of heads for picking up the components are arranged side by side along a specific direction, a head unit transfer device for moving the head unit, the board imaging device provided on the head unit for capturing an image of a board, and an imaging device moving device for moving the board imaging device along the head arrangement direction relative to the head unit, the method for moving the board imaging device of the mounting apparatus comprising the steps of preparing the mounting apparatus, and setting the board imaging device at a specified position by moving the head unit by the head unit transfer device and moving the board imaging device by the board imaging device.

According to this method, it is possible to achieve an increased efficiency of imaging operation, simplification of the apparatus structure and a cost reduction in the same way as described above.

Furthermore, a mounting method according to the present invention is a mounting method in a mounting apparatus comprising a board take-in device for bringing in a board to a specified mounting position, a head unit in which a plurality of heads for picking up components are arranged side by side along a specific direction, a head unit transfer device for moving the head unit, an imaging device support member disposed on the head unit movably along the head arrangement direction, a board imaging device provided on the imaging device support member for capturing an image of the board, a component imaging device provided on the imaging device support member for capturing images of the components, and an imaging device moving device for moving the imaging device support member along the head arrangement direction relative to the head unit, the mounting method comprising the steps of transporting the board to the mounting position by the board take-in device, capturing the image of the board by the board imaging device upon moving the head unit by the head unit transfer device and moving the board imaging device by the imaging device moving device, mounting the components on the board upon moving the components picked up by the heads of the head unit to the mounting position by the head unit transfer device, and capturing the images of the components by the component imaging device upon moving the component imaging device by the imaging device moving device.

According to this method, it is possible to capture the images of the board and the components with high efficiency.

BEST MODES FOR CARRYING OUT THE INVENTION

First Embodiment

Figure 1:
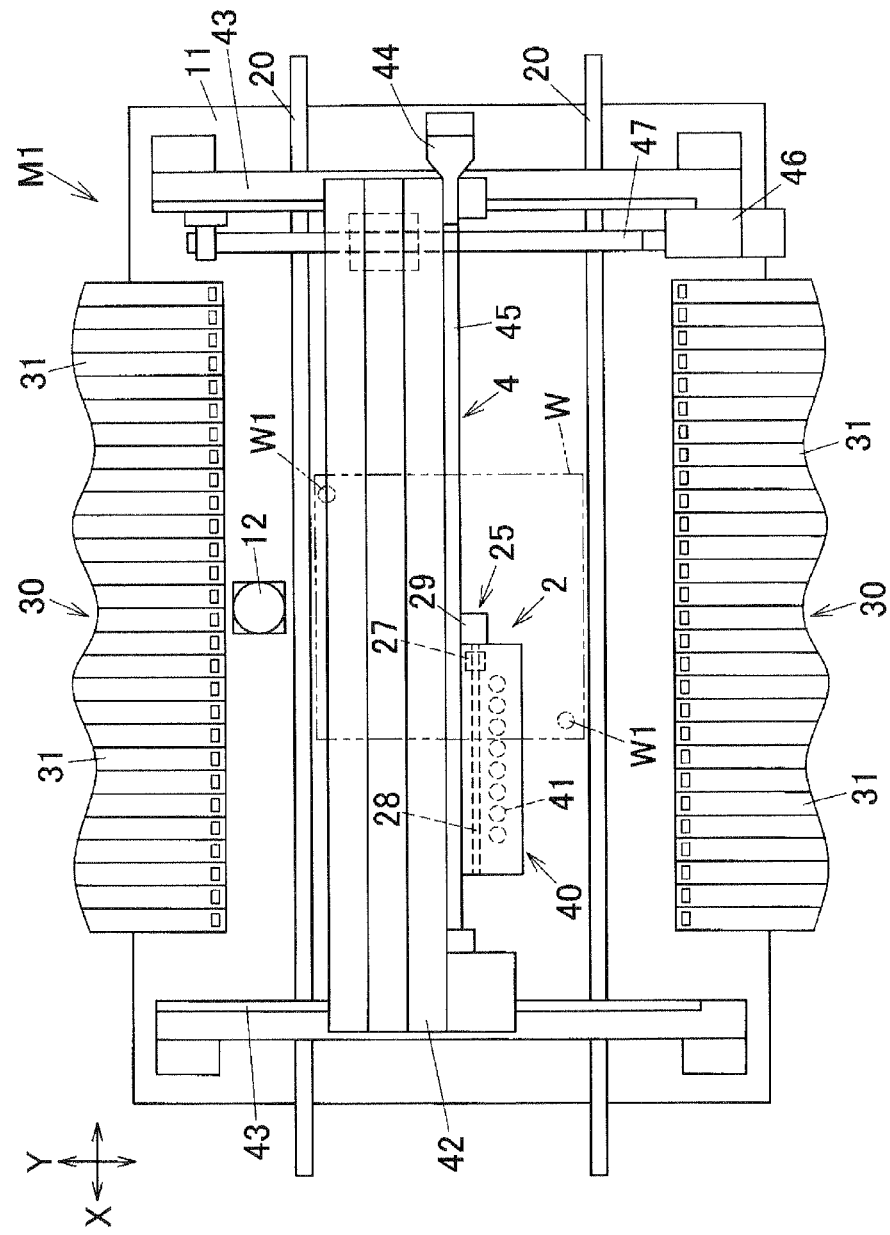
FIG. 1 is a plan view showing a mounting apparatus according to a first embodiment of the present invention.
Figure 2:
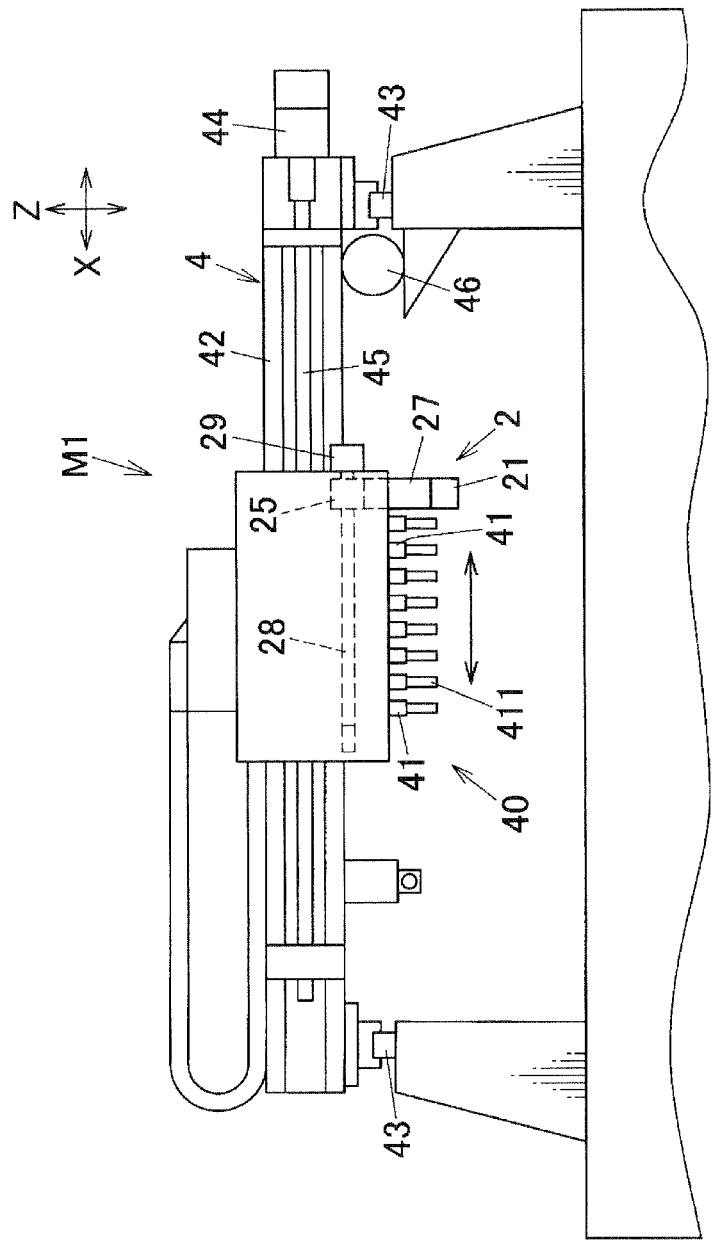
FIG. 2 is a front view showing a principal portion of the mounting apparatus of the first embodiment.
Figure 3:
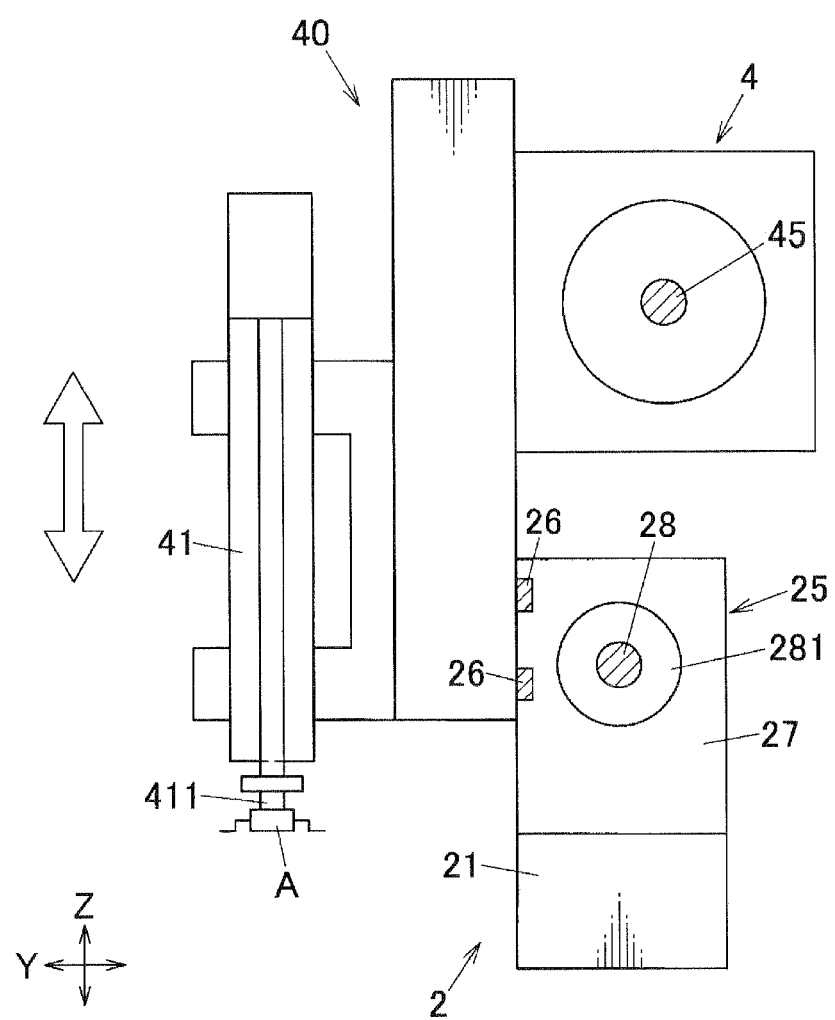
FIG. 3 is a side view showing a board imaging camera employed in the mounting apparatus of the first embodiment.
Figure 4:
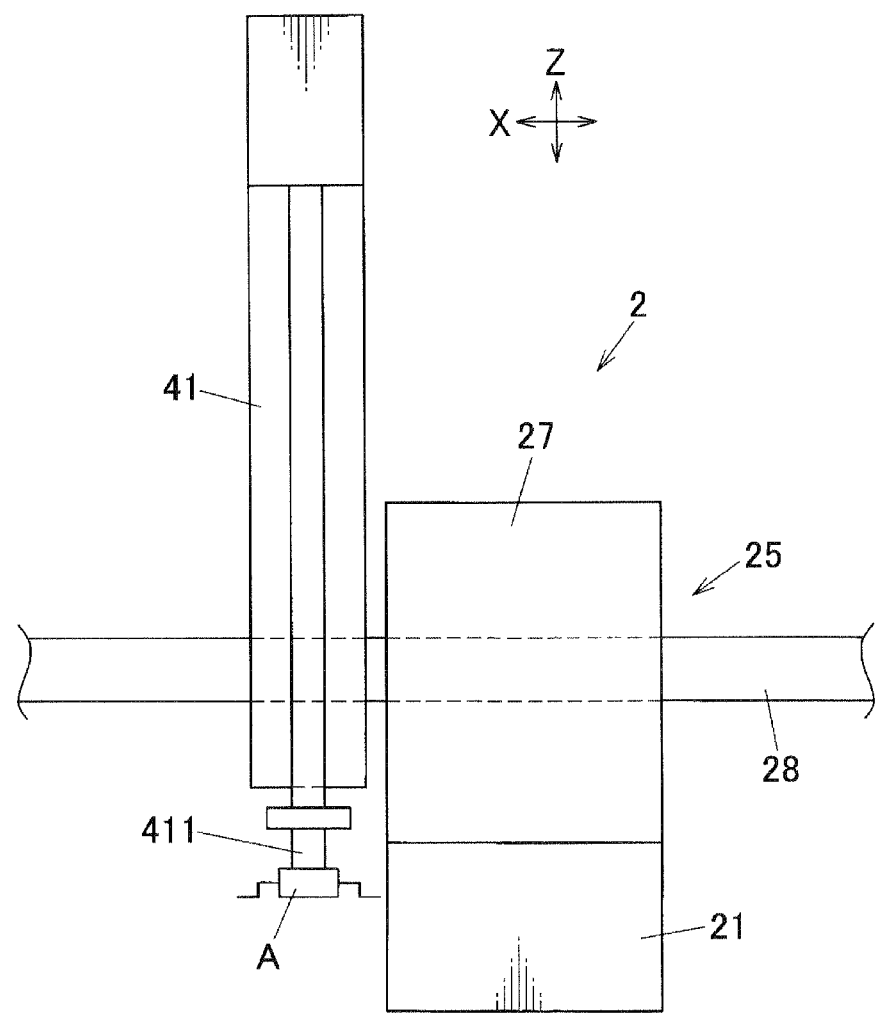
FIG. 4 is a front view showing a camera unit of the first embodiment.
Figure 5:
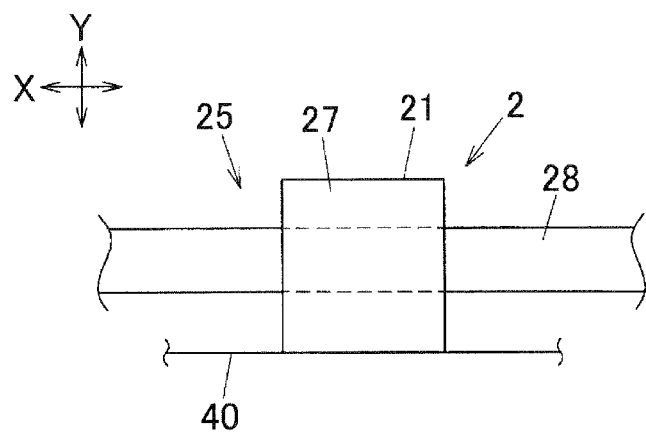
FIG. 5 is a plan view showing the camera unit of the first embodiment.

FIG. 1 is a plan view showing an example of a mounting apparatus M1 which is an embodiment of the present invention, and FIG. 2 is a front view showing a principal portion of the mounting apparatus M1.

As shown in both Figures, the mounting apparatus M1 comprises a conveyor 20 disposed on a platform 11, component feeding units 30 disposed on both sides of the conveyor 20 and a head unit 40 disposed above the platform 11.

The conveyor 20 is configured to provide capability to transport a bare board W from a board take-in device to a mounting position and convey the loaded board W from the mounting position to a board output portion. In this embodiment, the board take-in device is configured with the conveyor 20.

The component feeding units 30 are provided one each on front and rear sides of the conveyor 20. In this embodiment, the component feeding units 30 are configured such that a plurality of tape feeders 31 serving as component feeders arranged side by side can be connected to each of the component feeding units 30. Each of the tape feeders 31 has a reel on which a tape fitted with such electronic components as integrated circuits (ICs), transistors or capacitors is wound, so that the electronic components can be successively picked up and supplied to a suction point (part feeding point).

The head unit 40 is made movable within a range from each component feeding unit 30 and the mounting position on the board W so that the head unit 40 can pick up each component supplied from that component feeding unit 30 to the suction point and place that component on the board W. Specifically, the head unit 40 is supported movably along an X-axis direction by a head unit support member 42 extending along the X-axis direction (board transport direction of each conveyor 20). The head unit support member 42 is supported at both ends thereof movably along a Y-axis direction by guide rails 43 extending along the Y-axis direction (or the direction perpendicular to the X-axis in a horizontal plane). The head unit 40 is driven to move in the X-axis direction by an X-axis motor 44 via a ball screw 45, while the head unit support member 42 is driven to move in the Y-axis direction by a Y-axis motor 46 via a ball screw 47.

It is to be noted that the head unit support member 42, the guide rails 43, the X-axis motor 44, the ball screw 45, the Y-axis motor 46 and the ball screw 47 together constitute a head unit transfer device 4 in this embodiment.

The head unit 40 includes a plurality of placement heads 41 arranged along the X-axis direction for mounting the components.

The head unit 40 is configured such that the individual heads 41 can be driven to move in a vertical direction (Z-axis direction) by means of a raise/lower mechanism having a Z-axis motor as a prime mover and in a direction of rotation (R-axis direction) by means of a turning mechanism having an R-axis motor as a prime mover.

The placement heads 41 are individually provided with suction nozzles 411 for picking up electronic components A by suction and placing the same on the board W.

The suction nozzles 411 are each connected to an unillustrated negative pressure source. When a negative pressure is supplied from the negative pressure source to a particular suction nozzle 411, the relevant suction nozzle 411 picks up an electronic component A by suction produced by the negative pressure.

As shown in FIGS. 1 to 5, the head unit 40 is furnished with a camera unit 2 which includes a board imaging camera 21 serving as a board imaging device and an imaging device moving device (camera moving device) 25 for movably supporting the camera 21 on the head unit.

The camera moving device 25 has a linear guide 26 provided on the rear side of the head unit 40, continuously extending along the X-axis direction. This linear guide 26 is disposed over a long range from one end of the head unit 40 to the opposite end thereof along the X-axis direction.

This linear guide 26 is further provided with a camera support member (imaging device support member) 27 in a manner that the camera support member 27 can freely slide along a longitudinal direction (X-axis direction) of the linear guide 26.

Figure 6:
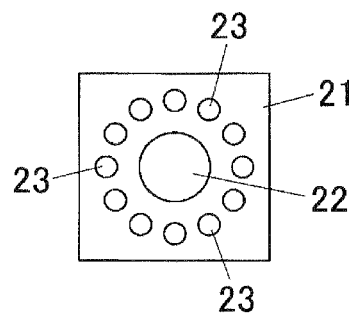
FIG. 6 is a bottom view showing a board imaging camera employed in the camera unit of the first embodiment.

The camera 21 is fixed to a bottom surface of the camera support member 27 with an image shooting direction of the camera 21 oriented downward. As illustrated in FIG. 6, an image-capturing portion of the camera 21 on a bottom side thereof is provided with a camera body 22 configured with an area camera like a charge-coupled device (CCD) camera and illumination devices 23 configured with a plurality of light emitting diodes (LEDs) or the like are disposed around the camera body 22.

It is possible with this camera 21 to recognize, for example, a position reference mark, a board identification (ID) mark, locations of components supplied from the component feeding units 30 like the tape feeders 31, and so on.

As shown in FIGS. 1 to 5, there is a ball screw 28 disposed rotatably about an axis thereof on the rear side of the head unit 40. This ball screw 28 is mounted along the X-axis direction parallel to the linear guide 26 to extend over the long range from one end of the head unit 40 to the opposite end thereof along the X-axis direction.

The camera support member 27 supporting the camera 21 is associated with a ball nut 281 fixedly mounted on the ball screw 28. The ball nut 281 is attached to the ball screw 28 in the manner of a threaded fitting.

Further, on the rear side of the head unit 40, there is attached a camera moving motor (camera X-axis motor) 29 like a servomotor to one end of the ball screw 28. As this motor 29 is driven to rotate, the ball screw 28 rotates so that the camera support member 27 moves along the X-axis direction together with the camera 21.

A movable range of the camera 21 is set to the range from one end of the head unit 40 to the opposite end thereof along the X-axis direction, so that the camera 21 can move outward beyond the heads 41 at both ends of the head unit 40.

In this embodiment, the linear guide 26, the camera support member 27, the ball screw 28, the camera moving motor 29, and so forth together constitute the camera moving device 25.

Further, there is provided a component imaging camera 12 made of a line sensor camera or the like between the component feeding units 30 on the rear side of the mounting apparatus M1 and the conveyor 20. This camera 12 is configured to provide capability to image each component transported by the head unit 40 from underside and detect a position offset of that component, for instance.

Figure 7:
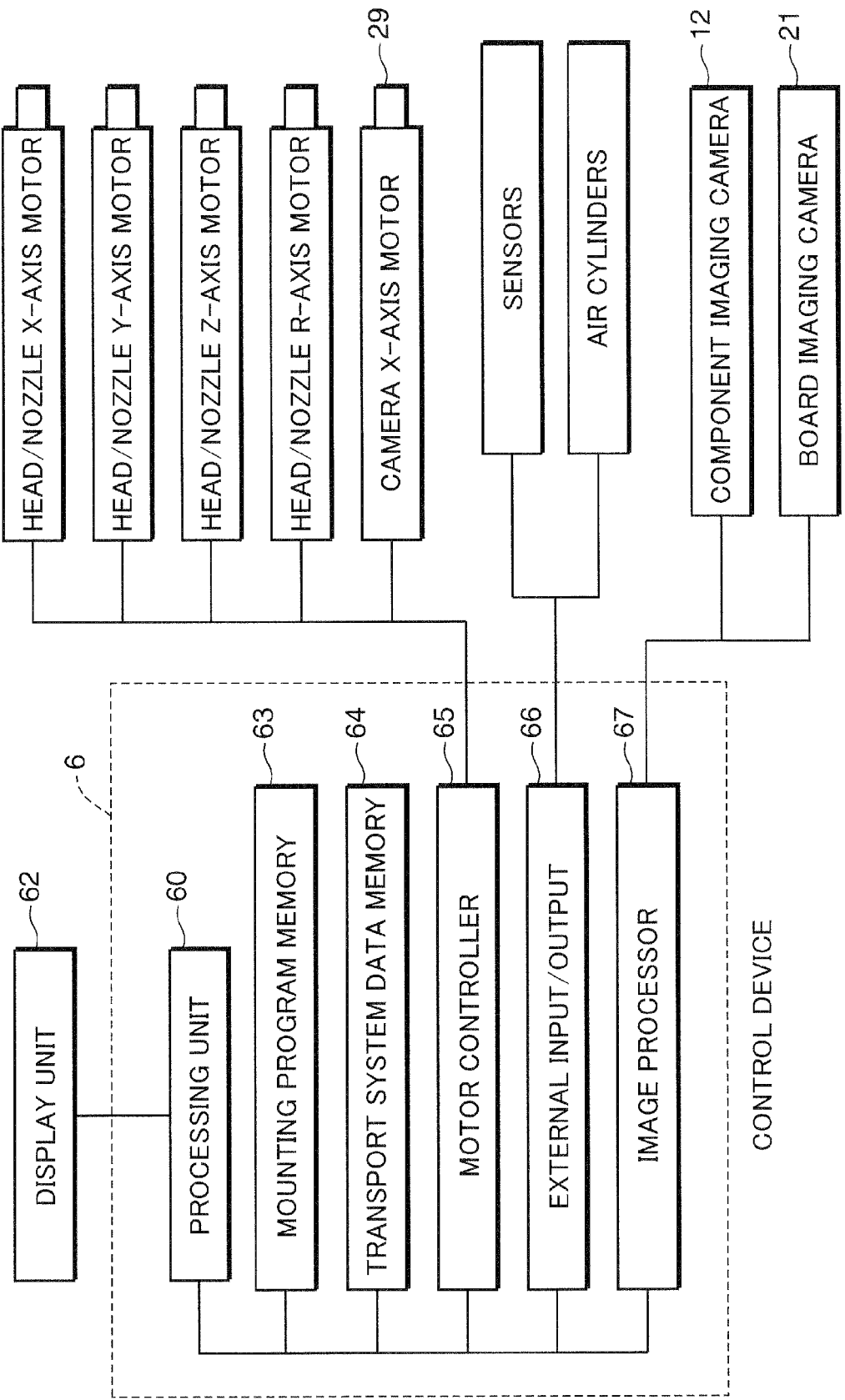
FIG. 7 is a block diagram showing a control system of the mounting apparatus of the first embodiment.
Figure 8:
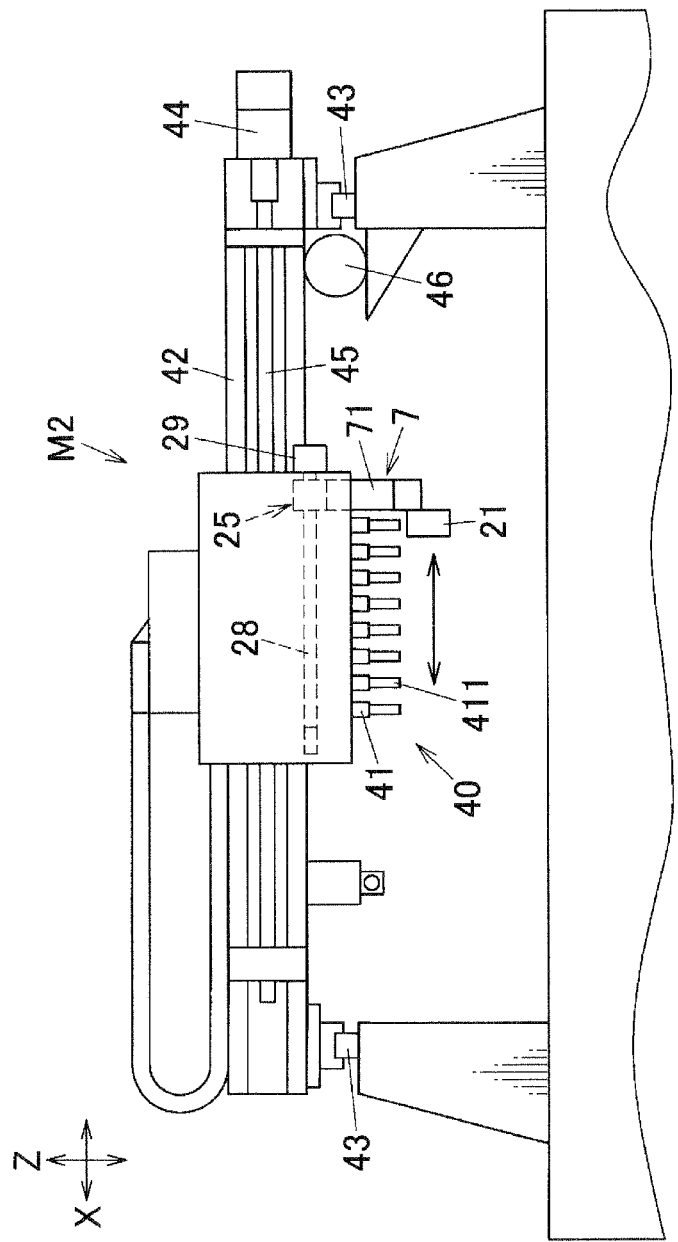
FIG. 8 is a plan view showing a mounting apparatus according to a second embodiment of the present invention.
Figure 9:
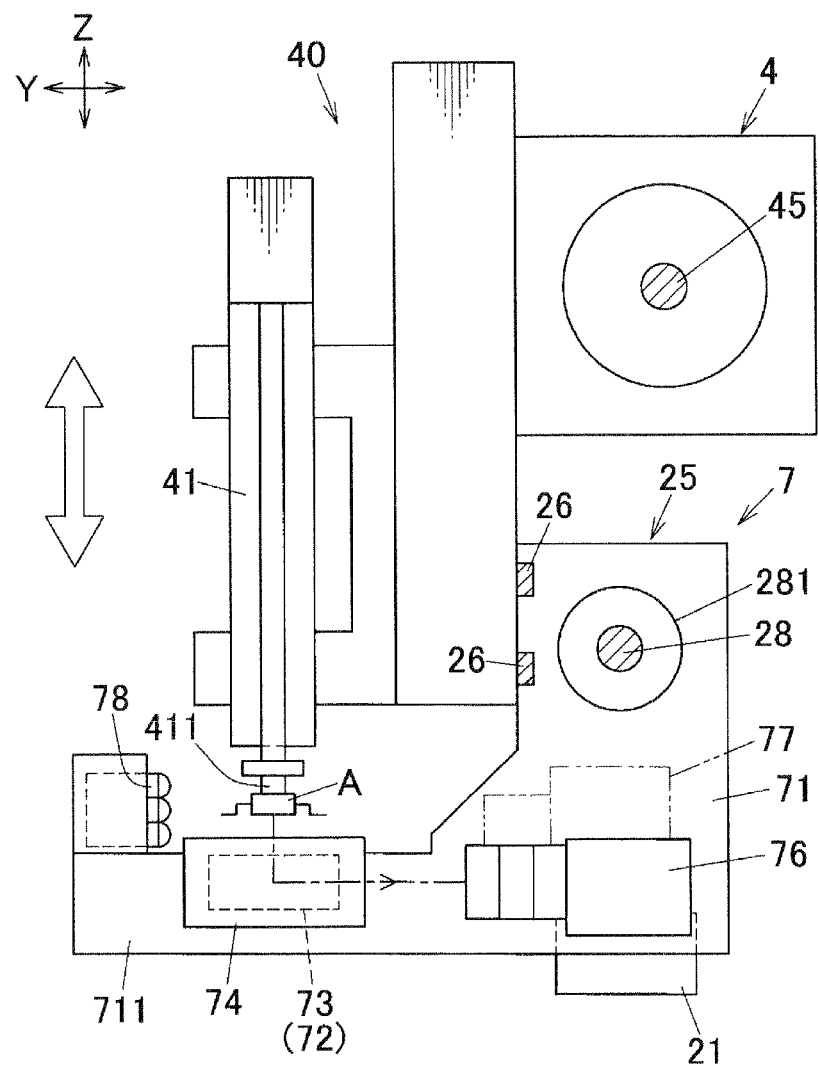
FIG. 9 is a side view showing a scan unit furnished with a board imaging camera employed in the mounting apparatus of the second embodiment.
Figure 10:
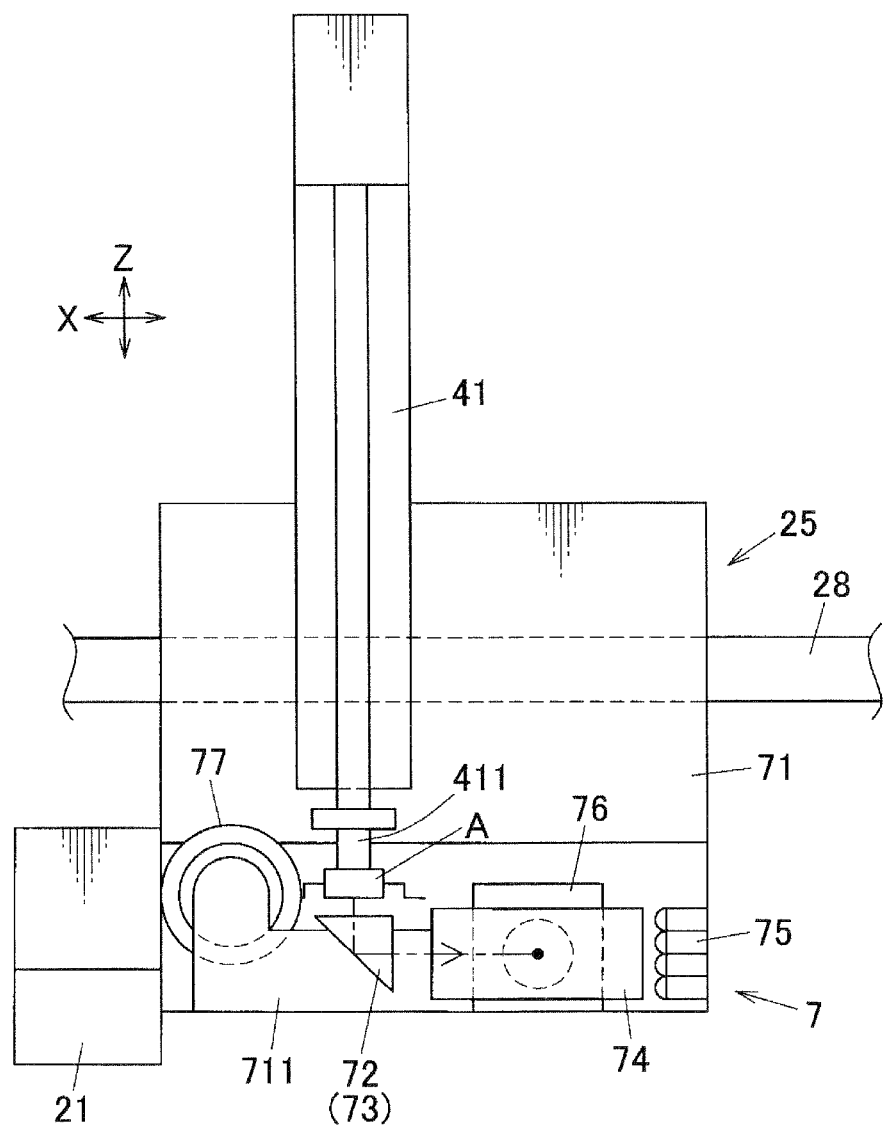
FIG. 10 is a front view showing the scan unit of the second embodiment.
Figure 11:
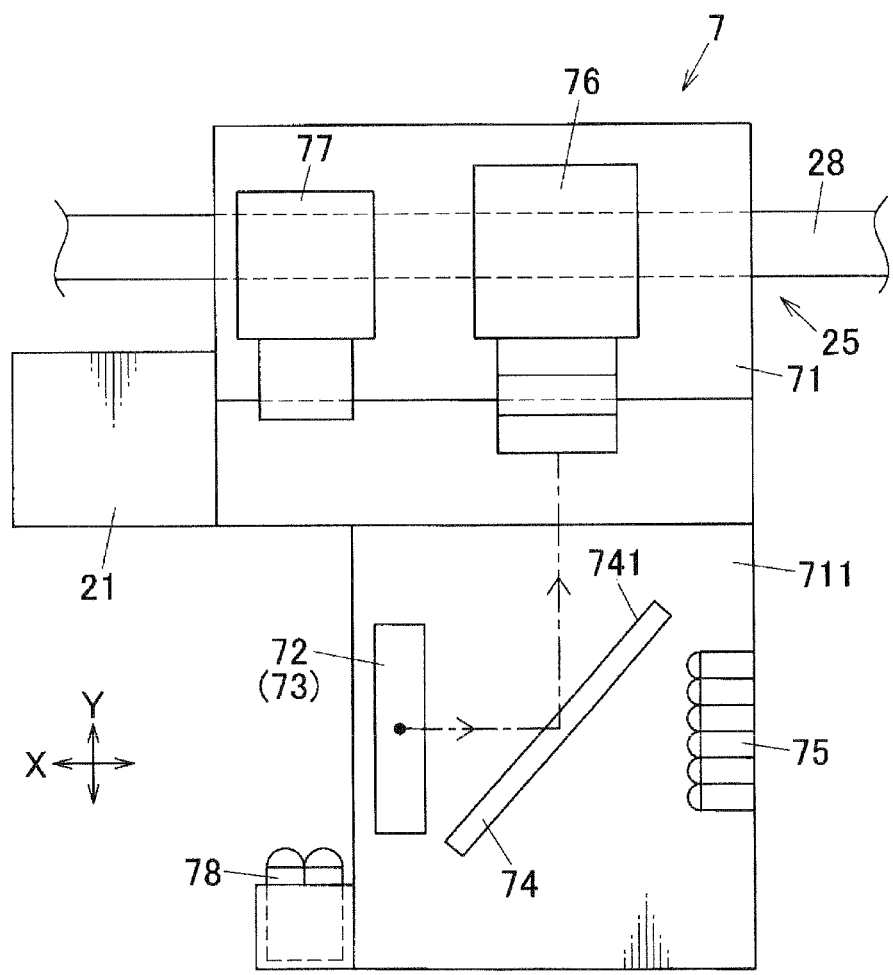
FIG. 11 is a plan view showing the scan unit of the second embodiment.

FIG. 7 is a block diagram showing a control system of the mounting apparatus M1. As shown in this Figure, the mounting apparatus M1 of the embodiment is provided with a control device (controller) 6 made of a personal computer or the like, which controls various kinds of operations performed by the mounting apparatus M1.

The control device 6 includes a processing unit 60, a mounting program memory 63, a transport system data memory 64, a motor controller 65, an external input/output block 66 and an image processor 67.

The processing unit 60 performs overall management of various kinds of operations performed by the mounting apparatus M1.

The mounting program memory 63 stores a mounting program (manufacturing program) used for mounting the individual electronic components on the board W. The manufacturing program contains data concerning mounting positions (coordinates) and orientations of the individual electronic components according to a circuit pattern of the board W as well as positions (coordinates) of the feeders 31 through which the individual electronic components are supplied, for example.

The transport system data memory 64 stores various kinds of data concerning how the board W is transported on a production line.

Also, the motor controller 65 controls operation of the individual driving motors of the X-, Y-, Z- and R-axes of the head unit 40 (heads 41) as well as the camera moving motor (camera X-axis driving motor) 29, for example.

The external input/output block 66 performs operations for outputting and inputting various kinds of information to and from drivers of various kinds of sensors, air cylinders for projecting and retracting the suction nozzles provided in the mounting apparatus M1.

The image processor 67 processes image data acquired by the component imaging camera 12 and the board imaging camera 21.

Also, the control device 6 is connected with such a display unit 62 as a cathode ray tube (CRT) display or a liquid crystal display for presenting various kinds of information. Furthermore, the control device 6 is connected with such an input unit (not shown) as a keyboard or a mouse for inputting various kinds of information.

In the mounting apparatus M1 thus configured, the control device 6 operates in response to an operation start command entered through the input unit. Then, the mounting apparatus M1 automatically performs the following operations with operations of the individual drivers controlled by the control device 6.

First, a bare board W is transported to a specified position by the conveyor 20. Then, the head unit 40 moves up to one of the component feeding units 30 and particular electronic components are picked up by the individual suction nozzles 411 of the relevant head unit 40.

Subsequently, the head unit 40 moves to the position of the board W and the components picked up by the individual suction nozzles 411 are mounted at specified positions on the board W.

As such operations are carried out repeatedly, the electronic components A are successively mounted on the board W. When all the electronic components A have been mounted on the board W, a process of mounting the electronic components A on the relevant board W is finished and, as a consequence, the loaded board W is output by the conveyor 20 and a bare board W is transported anew to the mounting position in preparation of the same component mounting process as discussed above.

In the mounting apparatus M1 of the present embodiment, the board imaging camera 21 captures an image of reference marks W1 or the like (refer to FIG. 1) provided on the board W to thereby recognize the locations of the components A supplied from the component feeding units 30 like the tape feeders 31, and so on, for instance.

When taking the image of the reference marks W1, the head unit 40 moves up to the position of the board and the board imaging camera 21 successively captures the image of imaging points of the board W, such as the plurality of reference marks W1 provided on the board W, while illuminating the imaging points of the board W by means of the illumination device 23.

In this embodiment, when moving the board imaging camera 21, not only the head unit 40 is moved by the head unit transfer device 4 but the board imaging camera 21 itself is also moved properly along the X-axis direction relative to the head unit 40 by means of the head unit transfer device 4 to thereby bring the board imaging camera 21 to the specified imaging points. This arrangement makes it possible to reduce the amount of movement of the head unit 40.

When moving the board imaging camera 21 up to the imaging points, it is possible to increase moving speed of the camera 21 and thereby move the camera 21 up to the imaging points with high efficiency by moving the board imaging camera 21 by the camera moving device 25 while moving the head unit 40 by the head unit transfer device 4.

It is to be pointed out that, when moving the board imaging camera 21 up to the imaging points, movement of the camera 21 by the camera moving device 25 may be initiated after moving the head unit 40 by the head unit transfer device 4 or movement of the head unit 40 may be initiated after moving the camera 21.

Also, the board imaging camera 21 or the head unit 40 may be moved alone as appropriate.

As mentioned in the foregoing discussion, the board imaging camera 21 is made movable along the X-axis direction relative to the head unit 40 in the mounting apparatus M1 of the present embodiment. It is therefore possible to reduce the amount of movement of the head unit 40 by the head unit transfer device 4, carry out imaging operation with high efficiency and achieve a reduction in size and weight of the apparatus.

Also, the number of the board imaging camera 21 provided in the head unit 40 is one in the mounting apparatus M1 of the present embodiment, so that it is possible to achieve a reduction in size, weight and cost of the apparatus in a more reliable fashion. Specifically, if two board imaging cameras are installed on the head unit, there arises the need to provide two sets of elements for carrying out the imaging operation, in addition to the cameras, including illumination means for image taking, camera lenses, lens mounts, camera cables (wirings), image processing ports, and so forth. In contrast, the mounting apparatus M1 of the present embodiment requires one each only of these elements related to the imaging operation. For this reason, it is possible to reduce the number of components, increase the efficiency of the imaging operation, simplify the structure and achieve a reduction in size, weight and cost of the apparatus in a more reliable fashion.

Moreover, compared to a case where a pair of board imaging cameras are provided, manpower required for adjustment and maintenance of the elements related to the imaging operation can roughly be halved, making it possible to mitigate work load of operators.

Additionally, if the board imaging camera 21 is moved by the head unit transfer device 4 while the head unit 40 is moved by the head unit transfer device 4, it is possible to increase the moving speed of the camera 21. This makes it possible to efficiently move the camera 21 up to the imaging points at high speed and reduce manufacturing time, resulting in a further improvement in production efficiency.

Second Embodiment

FIGS. 8 to 11 are diagrams showing a principal portion of a mounting apparatus M2 which is a second embodiment of the present invention.

As shown in these Figures, this mounting apparatus M2 greatly differs from the mounting apparatus M1 of the foregoing first embodiment in that the head unit 40 is provided with a scan unit 7 for capturing images of electronic components.

The scan unit 7 of the second embodiment of the second embodiment is configured to have capability to successively acquire images and perform image recognition of how electronic components A are picked up by suction while the electronic components A sucked by the suction nozzles 411 of the head unit 40 are being transported from the component feeding units 30 up to the specified positions.

Specifically, the scan unit 7 is provided with a camera support member 71 having an L-shaped side view, a bottom image capturing unit 72, a first light path changer 73, a second light path changer 74, a bottom side illumination device 75 and a bottom side imaging camera 76 serving as a component imaging device for capturing an image of a bottom side of each electronic component A captured by the bottom image capturing unit 72, wherein these elements 72-76 are arranged on a horizontal block 711 of the camera support member 71.

The scan unit 7 is further provided with a side imaging camera 77 serving as another component imaging device and a side illumination device 78, wherein these elements 77, 78 are arranged on the horizontal block 711.

There is provided a vertical piece of the camera support member 71 on the head unit 40 via the linear guide 26 disposed on the rear side thereof slidably along the X-axis direction in the same fashion as mentioned previously.

Additionally, the camera support member 71 is disposed movably generally parallel to a direction in which the heads 41 (suction nozzles 411) are arranged in the same fashion as mentioned previously by the motor 29 (refer to FIG. 8) like a servomotor provided in the head unit 7 by way of the ball screw 28. As this camera support member 71 moves along a row of suction nozzles (X-axis direction), the bottom side illumination device 75 provided on the camera support member 71 illuminates the bottom side of the electronic components A sucked by the individual suction nozzles 411 and the bottom side imaging camera 76 provided on the camera support member 71 acquires the image of the illuminated bottom side of the electronic components A.

The bottom image capturing unit 72 is a portion which makes it possible to capture the image of the bottom side of each electronic component A sucked by the suction nozzle 411 by passing beneath the suction nozzles 411 while the camera support member 71 is moving. In this embodiment, the bottom image capturing unit 72 is configured with the first light path changer 73, wherein there is provided a longitudinally elongate unillustrated slit between the first light path changer 73 and the suction nozzles 411 for limiting a light passing range to prevent extraneous disturbing light from falling upon the bottom side imaging camera 76.

The first light path changer 73 located beneath the suction nozzles 411 alters the direction of light oriented downward from the suction nozzles 411 by approximately 90° in a generally horizontal direction during the imaging operation to vary the direction of the light in a direction oriented sideways from beneath the suction nozzles 411. This first light path changer 73 is configured with a reflecting prism in this embodiment.

The second light path changer 74 is an optical device for further varying the direction of the light oriented sideways from the first light path changer 73 by further altering the direction of the light from the first light path changer 73 by approximately 90°. In this embodiment, the second light path changer 74 is configured with a half-silvered mirror. Therefore, a light path altering surface 741 of the second light path changer 74 works as a semitransparent surface for light incident from behind the light path altering surface 741 so that light emitted from the bottom side illumination device 75 provided at the back of the light path altering surface 741 is allowed to transmit to the front of the light path altering surface 741.

The bottom side illumination device 75 is a device for illuminating the bottom side of each electronic component A sucked by the suction nozzle 411 by projecting illuminating light in the direction of that electronic component A by way of the first light path changer 73 and the second light path changer 74, the bottom side illumination device 75 employing a plurality of light emitting diodes. In this embodiment, the bottom side illumination device 75 is provided generally on a line extended from a light path from the first light path changer 73 to the second light path changer 74 so that the illuminating light is projected from behind the light path altering surface 741 of the second light path changer 74 in the direction of the first light path changer 73. The bottom side illumination device 75 is configured in the aforementioned manner in order to illuminate the bottom side of each electronic component A sucked by the relevant suction nozzle 411 by the illuminating light which passes through the light path altering surface 741 of the second light path changer 74 and is reflected by the first light path changer 73.

The bottom side imaging camera 76 is a device for capturing the image of the bottom side of each electronic component A sucked by the relevant suction nozzle 411 and illuminated by the bottom side illumination device 75, the bottom side imaging camera 76 being configured with a CCD line sensor camera, for example. This bottom side imaging camera 76 is disposed with an image shooting direction thereof oriented horizontally in the direction of the light whose light path has been altered by the second light path changer 74.

The side imaging camera 77 is a device disposed at a position aside the bottom side imaging camera 76 for capturing an image of each electronic component A from one side thereof. Like the bottom side imaging camera 76, the side imaging camera 77 is configured with a CCD line sensor camera, for example.

The side illumination device 78 is a device for illuminating one side each electronic component A. The side illumination device 78 employs a plurality of light emitting diodes which are arranged at a far end of the horizontal block 711 of the camera support member 71 in such a fashion as to avoid interference with large-sized electronic components.

When the electronic components A are sucked by the suction nozzles 411 of the individual component feeding units 30, the bottom side imaging camera 76 and the side imaging camera 77 capture the images of the electronic components A carried by the suction nozzles 411 while the electronic components A are transferred from the component feeding units 30 to the board W. The image processor 67 (refer to FIG. 7) of the aforementioned control device 6 is configured to process the images thus acquired (or the images reflected from the bottom side of each electronic component A and the images transmitted from the side of each electronic component A).

Also, on one side end surface of the camera support member 71 the board imaging camera 21 serving as the board imaging device is fixed with the image shooting direction thereof oriented downward. As in the foregoing first embodiment, this board imaging camera 21 is provided with a camera body 22 configured with an area camera like a CCD camera and illumination devices 23 configured with a plurality of LEDs or the like are disposed around the camera body 22 (refer to FIG. 6).

This board imaging camera 21 which is fixed relative to the camera support member 71 is made movable along the X-axis direction in synchronism with the camera support member 71.

In this embodiment, the linear guide 26, the ball screw 28, the camera moving motor 29, the camera support member 71, and so forth together constitute the camera moving device 25 serving as an imaging device moving device. In addition, the camera support member 71 constitutes an imaging device support member.

The present second embodiment has otherwise the same configuration as the foregoing first embodiment, so that elements identical to those of the first embodiment are designated by the same reference symbols and a repeated description of such elements is not given here again.

As is the case with the foregoing first embodiment, after a bare board is transported to a specified position by the conveyor (board take-in device), the head unit 40 moves up to one of the component feeding units 30 and particular electronic components are picked up by the individual suction nozzles 411 of the relevant head unit 40. On the other hand, the head unit 40 moves to the position of the board and repeatedly carries out the component mounting process for mounting the electronic components A on the board.

Also, during execution of the component mounting process, the board imaging camera 21 acquires an image of reference marks W1 or the like to thereby recognize the board W as well as the locations of the components A supplied from the component feeding units 30 like the tape feeders 31, and so on, for instance in the same fashion as described previously.

Also when the board imaging camera 21 acquires the image, not only the head unit 40 is moved by the head unit transfer device 4 but the board imaging camera 21 is also moved properly along the X-axis direction together with the camera support member 71 by means of the camera moving device 25 to thereby bring the board imaging camera 21 to the imaging points. Furthermore, depending on the situation, the board imaging camera 21 is also moved by the camera moving device 25 while the head unit 40 is moved by the head unit transfer device 4.

In this embodiment, on the other hand, the cameras, 76, 77 successively acquire images of how the electronic components A are picked up by suction by the suction nozzles 411 of the head unit 40 while the head unit 40 is moving from the component feeding units 30 to the position of the board.

Specifically, while the head unit 40 is moving, the bottom side illumination device 75 projects the illuminating light in the direction of the first light path changer 73 from behind the second light path changer 74 and this illuminating light passes through the light path altering surface 741 of the second light path changer 74 and is reflected by the first light path changer 73, thereby illuminating the bottom side of each electronic component A sucked by the relevant suction nozzle 411.

At this time, the slit in the bottom image capturing unit 72 limits the light passing range to thereby limit the illuminating light from the bottom side illumination device 75 within an imaging range.

During the imaging operation, the first light path changer 73 located beneath the suction nozzles 411 alters the direction of light oriented downward from the suction nozzles 411 by approximately 90° in the generally horizontal direction to vary the direction of the light in the direction oriented sideways from beneath the suction nozzles 411, and the second light path changer 74 further alters the direction of the light from the first light path changer 73 by approximately 90° for further varying the direction of the light from the first light path changer 73. Then, the bottom side imaging camera 76 provided in the camera support member 71 acquires the image of the bottom side of each electronic component A by receiving this light.

The bottom side imaging camera 76 acquires the reflected image of the bottom side of each electronic component A sucked by the relevant suction nozzle 411 and illuminated by the bottom side illumination device 75 by way of the first light path changer 73 and the second light path changer 74 in the aforementioned manner.

Also, the side imaging camera 77 acquires the transmitted image of each electronic component A from one side thereof at the position aside the bottom side imaging camera 76.

The images thus acquired (or the images reflected from the bottom side of each component and the images transmitted from the side of each component) are processed by the control device 6 to permit recognition of how the electronic components A are picked up by suction.

As mentioned in the foregoing discussion, the board imaging camera 21 is made movable along the X-axis direction relative to the head unit 40 in the mounting apparatus M2 of this second embodiment. It is therefore possible to reduce the amount of movement of the head unit 40 and achieve an increase in efficiency of the imaging operation and a reduction in size and weight of the apparatus as in the foregoing embodiment. Furthermore, it is possible to reduce the number of components and achieve a reduction in size, weight and cost of the apparatus in a more reliable fashion as in the foregoing embodiment. It is also possible to further improve production efficiency.

Moreover, according to the mounting apparatus M2 of this second embodiment, the board imaging camera 21 is fixed to the scan unit 7 (camera support member 71) for capturing images of the components A, so that means for moving the individual imaging cameras, 76, 77 along the X-axis direction and means for moving the board imaging camera 21 along the X-axis direction can be combined into a single structure. In other words, it is not necessary to additionally provide dedicated moving means for moving the board imaging camera 21 and, therefore, the number of components can be further reduced by a corresponding amount, making it possible to further simplify the apparatus structure, and reduce the size, weight and cost of the apparatus.

While an area camera like a CCD camera is used as the board imaging camera (board imaging device) in the foregoing individual embodiments, the present invention is not limited to this arrangement alone but may employ a line sensor camera as the board imaging device. In this case, the board imaging device may be moved relative to a subject by moving the camera moving device 25 (imaging device moving device) when capturing an image of a board, for instance. Alternatively, the board imaging device may be moved relative to the subject by moving the head unit transfer device 4 or the board imaging device may be moved relative to the subject by moving both of the camera moving device 25 and the head unit transfer device 4.

Also, while the mounting apparatus is configured to move the board imaging device relative to the head unit along the X-axis direction in the foregoing embodiments, the present invention is not limited to this arrangement alone but may be so configured as to move the board imaging device relative to the head unit along the X-axis direction (or a direction perpendicular to the head arrangement direction in the horizontal plane). In this case, it is possible to further increase the imaging range of the board imaging device while reducing the amount of movement of the head unit.

Also, while the tape feeders are used as component feeders of the component feeding units in the foregoing embodiments, the invention is not limited to this arrangement alone but may employ tray feeders configured to supply components from component feeding vessels like palettes as the component feeders of the component feeding units in this invention.

The present invention thus far described can be summarized as follows.

Specifically, a mounting apparatus of the present invention is a mounting apparatus for mounting components on a board characterized by comprising a head unit in which a plurality of heads for picking up the components are arranged side by side along a specific direction, a head unit transfer device for moving the head unit, a board imaging device provided on the head unit for capturing an image of the board, and an imaging device moving device for moving the board imaging device along the head arrangement direction relative to the head unit.

According to this mounting apparatus, the amount of movement of the head unit by the head unit transfer device can be reduced, so that it is possible to perform imaging operation with high efficiency. Moreover, as the number of board imaging devices to be provided can be reduced in this mounting apparatus, it is possible to achieve simplification of the apparatus structure and a cost reduction.

More preferably, the mounting apparatus includes an imaging device support member disposed on the head unit movably along the head arrangement direction, and a component imaging device provided on the imaging device support member for capturing images of the components picked up by the heads, wherein the board imaging device is provided on the imaging device support member.

According to this mounting apparatus, it is possible to combine means for moving the component imaging device and means for moving the board imaging device into a single structure.

Also, a method for moving a board imaging device of the present invention is a method for moving the board imaging device of a mounting apparatus for mounting components on a board, the mounting apparatus which comprises a head unit in which a plurality of heads for picking up the components are arranged side by side along a specific direction, a head unit transfer device for moving the head unit, the board imaging device provided on the head unit for capturing an image of a board, and an imaging device moving device for moving the board imaging device along the head arrangement direction relative to the head unit, the method being characterized by comprising the steps of preparing the mounting apparatus, and setting the board imaging device at a specified position by moving the head unit by the head unit transfer device and moving the board imaging device by the board imaging device.

According to this moving method, it is possible to achieve an increased efficiency of imaging operation, simplification of the apparatus structure and a cost reduction in the same way as described above.

More preferably, the board imaging device is moved by the imaging device moving device during the time when the head unit is moved by the head unit transfer device.

According to this method, it is possible to move the board imaging device with high efficiency.

Also, a mounting method is a mounting method in a mounting apparatus which comprises a board take-in device for bringing in a board to a specified mounting position, a head unit in which a plurality of heads for picking up components are arranged side by side along a specific direction, a head unit transfer device for moving the head unit, an imaging device support member disposed on the head unit movably along the head arrangement direction, a board imaging device provided on the imaging device support member for capturing an image of the board, a component imaging device provided on the imaging device support member for capturing images of the components, and an imaging device moving device for moving the imaging device support member along the head arrangement direction relative to the head unit, the mounting method comprising the steps of transporting the board to the mounting position by the board take-in device, capturing the image of the board by the board imaging device upon moving the head unit by the head unit transfer device and moving the board imaging device by the imaging device moving device; mounting the components on the board upon moving the components picked up by the heads of the head unit to the mounting position by the head unit transfer device, and capturing the images of the components by the component imaging device upon moving the component imaging device by the imaging device moving device.

According to this mounting method, it is possible to capture the images of the board and the components with high efficiency.

INDUSTRIAL APPLICABILITY

As thus far described, the mounting apparatus, the mounting method thereof and the method for moving the board imaging device of the mounting apparatus of the present invention are useful in a mounting apparatus of which head unit is a equipped with board imaging device for capturing an image of a board.

Arrangements of the invention are suited for achieving high efficiency of board recognition as well as simplification of the apparatus structure and a cost reduction.

The invention claimed is:

1. A method for moving a board imaging device of a mounting apparatus which comprises a head unit in which a plurality of heads for picking up a component are arranged side by side along a specific direction, a head unit transfer device for moving the head unit, the board imaging device provided on the head unit for capturing an image of a board, and an imaging device moving device for moving the board imaging device along the head arrangement direction relative to the head unit, the method comprising:

setting the board imaging device at a specified position by moving the head unit by the head unit transfer device and moving the board imaging device by the imaging device moving device.

2. The method for moving a board imaging device of a mounting apparatus as recited in claim 1, wherein the board imaging device is moved by the imaging device moving device during the time when the head unit is moved by the head unit transfer device.

3. A mounting method in a mounting apparatus which comprises a board take-in device for bringing in a board to a specified mounting position, a head unit in which a plurality of heads for picking up a component are arranged side by side along a specific direction, a head unit transfer device for moving the head unit, an imaging device support member disposed on the head unit movably along the head arrangement direction, a board imaging device provided on the imaging device support member for capturing an image of the board, a component imaging device provided on the imaging device support member for capturing images of the components; and an imaging device moving device for moving the imaging device support member along the head arrangement direction relative to the head unit, the mounting method comprising the steps of:

transporting the board to the mounting position by the board take-in device;

capturing the image of the board by the board imaging device upon moving the head unit by the head unit transfer device and moving the board imaging device by the imaging device moving device;

mounting the components on the board upon moving the components picked up by the heads of the head unit to the mounting position by the head unit transfer device; and capturing the images of the components by the component imaging device upon moving the component imaging device by the imaging device moving device.

4. A mounting apparatus for mounting components on a board comprising:

An imaging device support member operatively associated with a head unit which is movable along a head arrangement direction, a head unit transfer device for moving the head unit, a component imaging device operatively associated with the imagining device support member for capturing images of a component picked up by a head, a board imaging device operatively associated with the head unit for capturing the image of the board and operatively associated with the imaging device support member and a moving device operatively associated with the support member for moving the board imaging device along the head arrangement direction relative to the component imaging device and head unit.

* * * * *